(12) United States Patent
Sewell et al.

(10) Patent No.: US 8,654,311 B2
(45) Date of Patent: Feb. 18, 2014

(54) LITHOGRAPHIC APPARATUS AND DEVICE MANUFACTURING METHOD

(75) Inventors: Harry Sewell, Ridgefield, CT (US); Jozef Petrus Henricus Benschop, Veldhoven (NL)

(73) Assignees: ASML Netherlands B.V., Veldhoven (NL); ASML Holding NV, Veldhoven (NL)

( * ) Notice: Subject to any disclaimer, the term of this patent is extended or adjusted under 35 U.S.C. 154(b) by 1000 days.

(21) Appl. No.: 12/419,819

(22) Filed: Apr. 7, 2009

(65) Prior Publication Data

US 2009/0257044 A1 Oct. 15, 2009

Related U.S. Application Data

(60) Provisional application No. 61/071,033, filed on Apr. 9, 2008.

(51) Int. Cl.
*G03B 27/54* (2006.01)

(52) U.S. Cl.
USPC .......................................................... 355/67

(58) Field of Classification Search
USPC .................................... 355/53, 55, 67, 71, 77
See application file for complete search history.

(56) References Cited

U.S. PATENT DOCUMENTS

| | | | |
|---|---|---|---|
| 5,933,216 A * | 8/1999 | Dunn ................................ | 355/53 |
| 6,611,316 B2 | 8/2003 | Sewell | |
| 6,800,408 B2 | 10/2004 | McCullough et al. | |
| 2001/0052966 A1* | 12/2001 | Fujitsuka et al. ................ | 355/53 |
| 2002/0109825 A1* | 8/2002 | Gui et al. ......................... | 355/53 |
| 2003/0190762 A1* | 10/2003 | Wang et al. ...................... | 438/14 |
| 2004/0114117 A1* | 6/2004 | Bleeker ............................ | 355/53 |
| 2006/0275712 A1* | 12/2006 | Anzai et al. ..................... | 430/321 |
| 2007/0013885 A1* | 1/2007 | Loopstra et al. ................ | 355/53 |
| 2007/0273854 A1 | 11/2007 | Nagasaka | |
| 2008/0013065 A1* | 1/2008 | Kohl ................................ | 355/67 |
| 2009/0040490 A1* | 2/2009 | Shigematsu et al. ............ | 355/66 |

FOREIGN PATENT DOCUMENTS

| | | |
|---|---|---|
| EP | 1 566 697 A2 | 8/2005 |
| JP | 9-17725 A | 1/1997 |
| JP | 2006-309908 | 11/2006 |
| JP | 2008-060546 | 3/2008 |
| WO | 2008/007632 | 1/2008 |

OTHER PUBLICATIONS

Translation of JP 2006-309908 published on Nov. 9, 2006.*

(Continued)

*Primary Examiner* — Glen Kao (74) *Attorney, Agent, or Firm* — Pillsbury Winthrop Shaw Pittman LLP (57) ABSTRACT

A lithographic apparatus and method for simultaneously exposing two patterning devices onto a substrate is disclosed. In an embodiment, a lithographic apparatus includes a plurality of illumination systems for receiving and conditioning a pulsed radiation beam, a beam director arranged between a source of the pulsed radiation and the illumination systems for alternately directing pulses of the radiation beam to the respective illumination systems, a support table for holding a plurality of patterning devices, each of the patterning devices being capable of imparting a respective conditioned radiation beam with a pattern in its cross-section to form a plurality of patterned radiation beams, and a projection system configured to project each of the plurality of patterned radiation beams coincidentally onto a target portion of a substrate. In an embodiment, the substrate is covered with a phase change material.

18 Claims, 3 Drawing Sheets

(56) References Cited

OTHER PUBLICATIONS

European Search Report for European Application No. 09 25 0895 dated May 29, 2009.

Japanese Office Action mailed Jun. 14, 2011 in corresponding Japanese Patent Application No. 2009-082271.

Taiwan Office Action dated Mar. 14, 2013 in corresponding Taiwan Patent Application No. 098110470.

* cited by examiner

LITHOGRAPHIC APPARATUS AND DEVICE MANUFACTURING METHOD

This application claims priority and benefit under 35 U.S.C. §119(e) to U.S. Provisional Patent Application No. 61/071,033, entitled "Lithographic Apparatus and Device Manufacturing Method", filed on Apr. 9, 2008. The content of that application is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via projection using a projection system onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

There is a continuing desire to be able to generate patterns with finer resolution. In general, shorter wavelength radiation may be used in order to achieve a finer resolution pattern. Step and scan systems are becoming resolution limited, particularly using radiation of 193 nm wavelength. Resolution has been extended using immersion lithography which allows a numerical aperture (NA) increase to approximately 1.56 NA. This will support 32 nm (half pitch) resolution. To go to higher resolution, particularly using 193 nm wavelength illumination, will require the development of new patterning techniques.

A patterning technique that has been proposed to increase the resolution is the multiple exposure technique. In this technique, target portions on the substrate are exposed twice or more. Such multiple exposures can be done using a different pattern for each exposure or using a different optical setting in the projection system or the illumination system of the lithographic apparatus or both. In case a different pattern is used for the different exposures, these different patterns can, e.g., be provided by different patterning devices. As an example, it may be desirable for a substrate to have both an exposure using a phase shift mask and an exposure with a trim mask. It may be desirable that both exposures have different exposure conditions. Conventionally, such a 'double exposure' is obtained by first exposing the entire substrate with a first patterning device (e.g., a phase shift mask), then exchanging the first patterning device with a second patterning device (e.g., a trim mask) and exposing the entire substrate with the second patterning device. This procedure is rather time consuming and generally results in inferior performance with respect to throughput (i.e., number of substrates that is processed per unit of time).

A possible drawback of changing the patterning devices can be mitigated by using multiple patterning devices on one stage, as described in U.S. Pat. No. 6,800,408. Despite the use of multiple patterning devices on one stage, the patterning technique of U.S. Pat. No. 6,800,408 may still have a significant impact on the throughput of the apparatus compared to a single exposure technique. This is due to the consecutive patterning of the first and the second patterning devices onto the target portion of the substrate. This drawback may be mitigated by simultaneously patterning the first and second patterning devices onto the target portion of the substrate, as described in U.S. Pat. No. 6,611,316. U.S. Pat. No. 6,611,316 describes a patterning technique wherein two reticle images are produced side-by-side in a field plane of the projection system.

SUMMARY

Arranging two separate side-by-side reticle images in a field plane of the projection system may have a drawback. A drawback is that when correcting for optical aberrations of the projection system, a larger area of the field plane should be taken into account. Since the two side-by-side images traverse different parts of the projection system, they may be differently affected by optical aberrations of the projection system. Due to the limited possibilities in correcting optical aberrations, side-by-side images in the field plane may not be optimized separately. Instead, a compromise is made between the side-by-side images.

Therefore, it is desirable, for example, to provide an improved multiple exposure patterning technique and/or an improved lithographic apparatus.

According to an aspect of the invention, there is provided a lithographic apparatus comprising a plurality of illumination systems for receiving and conditioning a pulsed radiation beam, a beam director arranged between a source of the pulsed radiation beam and the illumination systems for alternately directing pulses of the radiation beam to the respective illumination systems; a support table for holding a plurality of patterning devices associated with a certain pattern, each of the patterning devices being capable of imparting a respective conditioned radiation beam with a pattern in its cross-section to form respective patterned radiation beams; a substrate table for holding a substrate; and a projection system for projecting each of the plurality of patterned radiation beams coincidentally onto a target portion of the substrate to obtain the certain pattern on the substrate.

In an embodiment, the beam director is arranged to alternately direct single pulses to the respective illumination systems.

In a further embodiment, the substrate is substantially coated with a phase change material layer. The phase change material layer may be in a crystalline or polycrystalline state before exposure to the radiation.

In a further embodiment, the support table and substrate table are synchronized scanning tables.

In a further embodiment, the beam director is arranged to alternately direct groups of pulses to the respective illumination systems.

In a further embodiment, the lithographic apparatus is an immersion lithographic apparatus.

In a further embodiment, the beam director is a beam combiner or beam splitter.

In a further embodiment, the lithographic apparatus comprises a radiation source for providing the pulsed radiation beam.

In a further embodiment, the lithographic apparatus comprises a plurality of radiation sources, each radiation source configured to provide a pulsed radiation beam and corresponding to a respective illumination system and wherein the beam director comprises a control unit for alternately triggering the radiation sources to generate a single pulse or a plurality of pulses.

In a further embodiment, the plurality of illumination systems are arranged to individually condition the respective radiation beams corresponding to the respective patterns.

According to an aspect of the invention, there is provided a device manufacturing method comprising providing a pulsed radiation beam, alternately directing pulses of the radiation beam to a plurality of illumination systems to produce a plurality of respective conditioned radiation beams, directing each of the respective conditioned radiation beam to one of a plurality of patterning devices, each of the patterning devices having a respective pattern, imparting each of the conditioned radiation beams with the respective pattern in the respective cross-section of the conditioned radiation beam to form a plurality of respective patterned radiation beams, and projecting each of the plurality of patterned radiation beams coincidentally onto a target portion of a substrate.

In an embodiment, the method comprises alternately directing single pulses to the respective illumination systems.

In a further embodiment of the method, the substrate is coated with a phase change material layer.

In a further embodiment, the method further comprises synchronously scanning the patterning devices and the substrate.

In a further embodiment, the method comprises alternately directing groups of pulses to the respective illumination systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
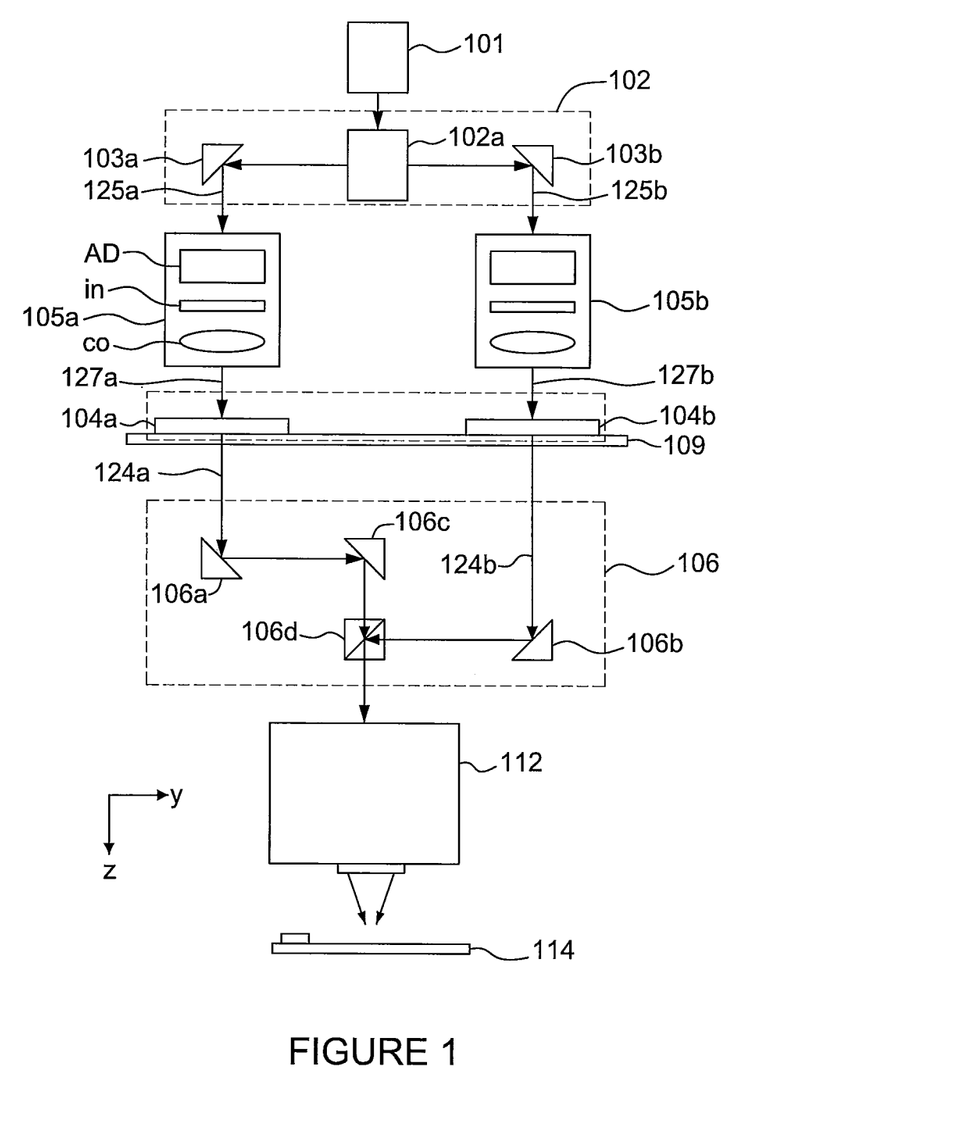
FIG. 1 schematically depicts a lithographic apparatus according to an embodiment of the invention.

FIG. 1 schematically depicts a lithographic apparatus according to an embodiment of the invention. The apparatus comprises a radiation source 101 configured to produce a pulsed radiation beam 107. The radiation source 101 may be, for example, an excimer laser generating pulsed UV or deep-UV radiation. Any pulsed illumination resist exposing source is suitable. The radiation source and the lithographic apparatus may be separate entities. In such cases, the radiation source is not considered to form part of the lithographic apparatus and the radiation beam is passed from the radiation source 101 to a beam director 102 (as discussed hereafter) with the aid of a beam delivery system (not shown).

A beam director 102 is arranged to receive the radiation beam 107 and alternately direct pulses of the radiation beam towards a first illumination system 105a, and a second illumination system 105b. The pulses directed to the first illumination system form a first radiation beam 125a and the pulses directed to the second illumination system form a second radiation beam 125b. The first and second illumination systems 105a, 105b are configured to condition respectively the first and second radiation beams 125a, 125b to form respectively conditioned radiation beams 127a and 127b. A support table 109 is arranged downstream of the first and second illumination systems to support a first patterning device 104a and a second patterning device 104b. The first patterning device 104a and second patterning device 104b pattern the respective conditioned radiation beams 127a and 127b to form respective patterned radiation beams 124a, 124b. A beam combiner 106 is arranged to receive and redirect the patterned radiation beams 124a, 124b along a single optical axis towards a projection system 112. The projection system 112 is arranged to project the patterned radiation beams 124a, 124b onto a layer of radiation-sensitive material (resist) provided on a target portion of a substrate (not shown). The substrate is supported by a substrate table 114.

The beam director 102 comprises a redirecting element 102a and reflective elements 103a and 103b. The redirecting element 102a is arranged to redirect pulses alternately to the first illumination system 105a and the second illumination system 105b via respectively reflective elements 103a and 103b. The redirecting element 102a may be a rotatable mirror that is synchronized with the output of pulses of the radiation source 101. Alternatively or additionally, the beam director 102 may comprise one or more other optical elements to redirect pulses to the first and second illumination systems.

The first illumination system 105a and the second illumination system 105b may each comprise an adjuster AD to adjust an angular intensity distribution of the respective first and second radiation beams 125a, 125b. The adjuster may be an optical arrangement comprising a zoom and an axicon element or a micro mirror array. In addition, the first and second illumination systems may each comprise one or more other components, such as an integrator IN and a condenser CO. The illumination systems may be used to condition the respective radiation beams to have a desired uniformity and intensity distribution in its cross section. Alternatively or additionally, the configuration of the second illumination system 105b may be different from the configuration of the first illumination system 105a. In this embodiment, the first and second illumination systems may be optimized individually to optimally condition the respective first and second radiation beams 125a, 125b for specific respective patterns of the first and second patterning devices 104a, 104b.

The support table 109 holds both the first and second patterning devices 104a, 104b. It holds the patterning devices in a manner that depends on the orientation of the patterning devices, the design of the lithographic apparatus, and other conditions, such as for example whether or not the patterning device is held in a vacuum environment. The support table can use mechanical, vacuum, electrostatic or other clamping techniques to hold the patterning devices. The support table may be fixed or movable as required. In general, movement of the support table may be realized with the aid of a long-stroke module (coarse positioning) and a short-stroke module (fine positioning). In an embodiment (not shown), patterning devices 104a, 104b are supported by a separate support table respectively. In this embodiment, the two separate support tables are synchronized to expose corresponding portions of the first and second patterning devices.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit. The patterning device may be transmissive or reflective and referred to as "mask" or "reticle". Masks are well known in lithography, and include mask types such as binary, alternating phase-shift, and attenuated phase-shift, as well as various hybrid mask types.

The beam combiner 106 comprises reflective elements 106a, 106b, 106c to redirect the respective patterned radiation beams 124a, 124b towards beam combiner cube 106d. Alternatively or additionally, other redirecting structures may be arranged to redirect and combine the respective patterned radiation beams 124a, 124b.

The projection system 112 may be a refractive, reflective and catadioptric optical system, or any combination thereof, as appropriate for the exposure radiation being used, or for other factors such as the use of an immersion liquid or the use of a vacuum. As here depicted, the lithographic apparatus is of a transmissive type employing transmissive patterning devices. Alternatively, the lithographic apparatus may be of a reflective type employing reflective patterning devices.

The substrate table 114 is arranged to position the substrate with respect to the projection system 112. Movement of the substrate table WT may be realized using a long-stroke module and a short-stroke module. The lithographic apparatus may be of a type having two or more substrate tables. In such "multiple stage" machines the additional tables may be used in parallel, or preparatory steps may be carried out on one or more tables while one or more other tables are being used for exposure.

The lithographic apparatus may be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are known in the art for increasing the numerical aperture of a projection system. The term "immersion" as used herein does not mean that a structure, such as a substrate, must be submerged in liquid, but rather only means that liquid is located between the projection system and the substrate during exposure.

In operation, the radiation source produces a pulsed radiation beam 107 of which a first portion of pulses is directed towards the first illumination system 105a and first patterning device 104a. A second portion of pulses is directed towards the second illumination system 105b and second patterning device 104b. The pulses directed to the first illumination system form a first radiation beam 125a and the pulses directed to the second illumination system form a second radiation beam 125b. The first and second illumination systems 105a, 105b condition respectively the first and second radiation beams 125a, 125b to form respectively conditioned radiation beams 127a, 127b. The first and second radiation beams 127a, 127b are incident on respectively the first and second patterning devices 104a, 104b. The first and second patterning devices 104a, 104b pattern the respective conditioned radiation beams 127a and 127b to form respective patterned radiation beams 124a, 124b. The patterned radiation beams 124a, 124b are spatially combined by beam combiner 106 such that the patterned radiation beams 124a, 124b propagate coincidentally with respect to each other upon exiting the beam combiner 106. It is emphasized that in this context, "coincident" should be interpreted to have its usual geometric meaning pertaining to the relationship between two vectors. Vectors can be said to be coincident when their direction is substantially the same though the magnitude may be different. The patterned radiation beams may be regarded as vectors, each having a magnitude and a direction. Thus, upon exiting the beam combiner, the two patterned radiation beams 124a, 124b propagate along the same optical axis towards the projection system 112 but may have different intensities. The projection system projects the respective patterned radiation beams onto a target portion of the substrate. As mentioned above, the beam director 102 alternately directs pulses towards the first and second illumination systems. Since little or no pulse stretching occurs along the optical paths traversing the respective illumination systems, patterning devices, respective sections of the beam combiner and the projection system, the patterned radiation beams 124a and 124b are time separated when incident on the substrate. Thus, the pattern of the first patterning device and the pattern of the second patterning device are alternately projected onto the target portion of the substrate.

The lithographic apparatus could be used in step mode or in scan mode:

1. In step mode, the support table 109 and the substrate table 114 are kept essentially stationary, while an entire pattern imparted to the respective radiation beams is projected alternately onto a target portion of the substrate. The substrate table 114 is then shifted in the X and/or Y direction so that a different target portion can be exposed. In step mode, the maximum size of the exposure field limits the size of the target portion imaged in a single static exposure.

2. In scan mode, the support table 109 and the substrate table 114 are scanned synchronously while a pattern imparted to the respective radiation beams is projected alternately onto a target portion of the substrate. The velocity and direction of the substrate table 114 relative to the support table 109 may be determined by the (de-)magnification and image reversal characteristics of the projection system 112. In scan mode, the maximum size of the exposure field limits the width (in the non-scanning direction) of the target portion in a single dynamic exposure, whereas the length of the scanning motion determines the height (in the scanning direction) of the target portion. In scan mode, portions of the patterns of the respective patterning devices are projected alternately onto the target portion of the substrate.

After completion of the exposure of the substrate, the resist is developed. Only the areas that have been exposed by the first or second patterned radiation beam above a threshold level of the resist will become soluble in resist in the case of a positive tone resist. In the case of a negative tone resist, non-exposed areas of the resist are developed. Therefore, after development the resist comprises a pattern that is equal to the super-imposed patterns of the first and second patterning devices.

Figure 2:
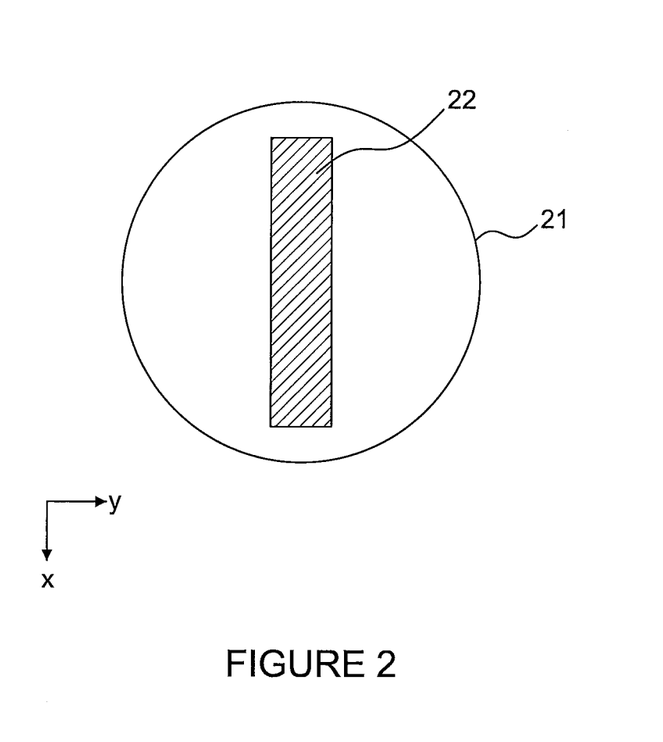
FIG. 2 schematically depicts a pupil in the projection system of the lithographic apparatus according to an embodiment of the invention.

FIG. 2 schematically depicts a pupil 21 in the projection system of the lithographic apparatus according to an embodiment of the invention. In the lens pupil 21, an illumination slit 22 is schematically shown at a field plane of the projection system, i.e. the plane that is conjugate to the patterning device plane and the substrate plane. In this embodiment, the lithographic apparatus is a lithographic apparatus operated in scanning mode, wherein 'y' is the direction of scanning. The illumination slit 22 represents the patterned radiation beams 124a and 124b as they alternately traverse the projection system along the same optical axis. Due to the alternate traversal of the patterned radiation beams along the same optical axis, optical aberrations and other optical parameters of the projection system should be optimized for the cross-sectional area of the pupil that is traversed by the illumination slit 22 only.

In an embodiment, the resist used is a fast acting thresholding resist system. This means that in the resist, the exposure chemistry that results from the resist being exposed by the patterned radiation beam is completed fast. This is desirable so that the exposure of the two exposure images, and the thereby created chemical reactions in the resist system, do not influence each other. For example, a region of the resist adjacent to an area that has been exposed to a first dose of radiation may be undesirably affected by the first dose of radiation such that that region retains a 'memory' of that first dose, which can be detrimental to the patterning accuracy of a subsequent second dose of radiation on that region.

In an embodiment, the resist system covering the substrate comprises a phase change material. The phase change material may be a chalcogenide glass such as Germanium-Antimony-Tellurium (GeSbTe) or Silver-Indium-Antimony-Tellurium (AgInSbTe). Alternatively, the phase change material may be any other phase change material that can be applied to a substrate using a crystalline growth process or other deposition technique. A phase change material is a material that changes from a crystalline state to an amorphous state or from an amorphous state to a crystalline state under influence of heat. The transition from a first state to a second state occurs upon application of an amount of heat in excess of a well-defined threshold level which is dependent upon the particular phase change material chosen. In this embodiment, the amount of heat in excess of the threshold level to cause the transition from the first state to the second state is delivered using radiation from the patterned radiation beam. The threshold level of heat can be accurately translated by calculation into a threshold level of radiation intensity to be obtained from the patterned radiation beam. Only areas of the phase change material which are exposed to radiation in excess of the threshold level should change from an amorphous state to a crystalline state or from an amorphous state to a crystalline state. Due to the well-defined threshold level, a region adjacent to an intended patterned area which is exposed to less than that threshold level of radiation should not change state and so should retain substantially no 'memory' of the previous exposure. After cooling, the phase change material has essentially 'forgotten' any partial exposure resulting from the proximity tail of the aerial image associated with any of the multiple exposures. Only the regions of the phase change material which have been exposed to radiation above the threshold level of radiation should become soluble (or insoluble, as the case may be) in developer.

In an embodiment, the phase change material layer is in a crystalline or polycrystalline state before exposure to the radiation. Desirably the phase change material layer is a crystalline thin film layer. The film may be considered a thermal imaging layer since heat is used to form an image in the film which can then be developed under suitable conditions. Moreover, the film has the property of having substantially no 'memory' of previous partial exposures which do not reach the threshold exposure.

In step mode, the patterning exposure of the first pattern selectively heats the crystalline film and converts a first portion of selected regions of the phase change material to an amorphous state. The film is effectively melted locally with high precision, and pooled. The molten regions are then re-solidified into an amorphous state by rapid thermal quenching. In this way, the phase change material acts like a threshold resist. Subsequently, the patterning exposure of the second pattern selectively heats the crystalline film and converts a second portion of selected regions of the phase shift material to an amorphous state. As with the exposure of the first pattern, in the second exposure the film is effectively melted locally and the molten regions are then re-solidified into an amorphous state by rapid thermal quenching. When the second pattern exposure is made, the film has substantially no 'memory' of the first pattern exposure other than at the pattern areas where the exposure threshold was exceeded and the crystalline film was converted to an amorphous state. There are therefore substantially no proximity effects between sequentially exposed patterns caused by partial exposure tails on the image. After developing the phase change material, the substrate comprises a crystalline phase change material having a pattern that is equal to the super-imposed patterns of the first and second patterning devices (or comprises an amorphous phase change material having a pattern that is equal to the super-imposed patterns of the first and second patterning devices, as the case may be).

In scan mode, the patterning exposure of a first portion of the first pattern selectively heats the crystalline film and converts a first portion of selected regions of the phase change material to an amorphous state. The film is effectively melted locally with high precision, and pooled. The molten regions are then re-solidified into an amorphous state by rapid thermal quenching. In this way, the phase change material acts like a threshold resist. Subsequently, the patterning exposure of a second portion of the second pattern selectively heats the crystalline film and converts a second portion of selected regions of the phase shift material to an amorphous state. As with the exposure of the first portion of the first pattern, in the second exposure the film is effectively melted locally and the molten regions are then re-solidified into an amorphous state by rapid thermal quenching. This process is repeated during the alternating exposures of portions of the first and second patterning device until the entire first and second pattern have been projected onto the phase change material. After developing the phase change material, the substrate comprises a crystalline phase change material (or an amorphous phase change material, as the case may be) having a pattern that is equal to the super-imposed patterns of the first and second patterning devices.

The particular exposure time employed will be a function of various parameters, including the type of radiation source used, the radiation source pulse length and the beam power. It is desirable that the duration of exposure of the portions being alternately exposed is in the range of around 1 nanosecond to around 1 microsecond, or in the range of around 50 to 200 nanoseconds. Alternatively to alternately directing pulses towards the first and the second illumination systems, groups of pulses may be alternately directed towards the first and the second illumination systems.

Figure 3:
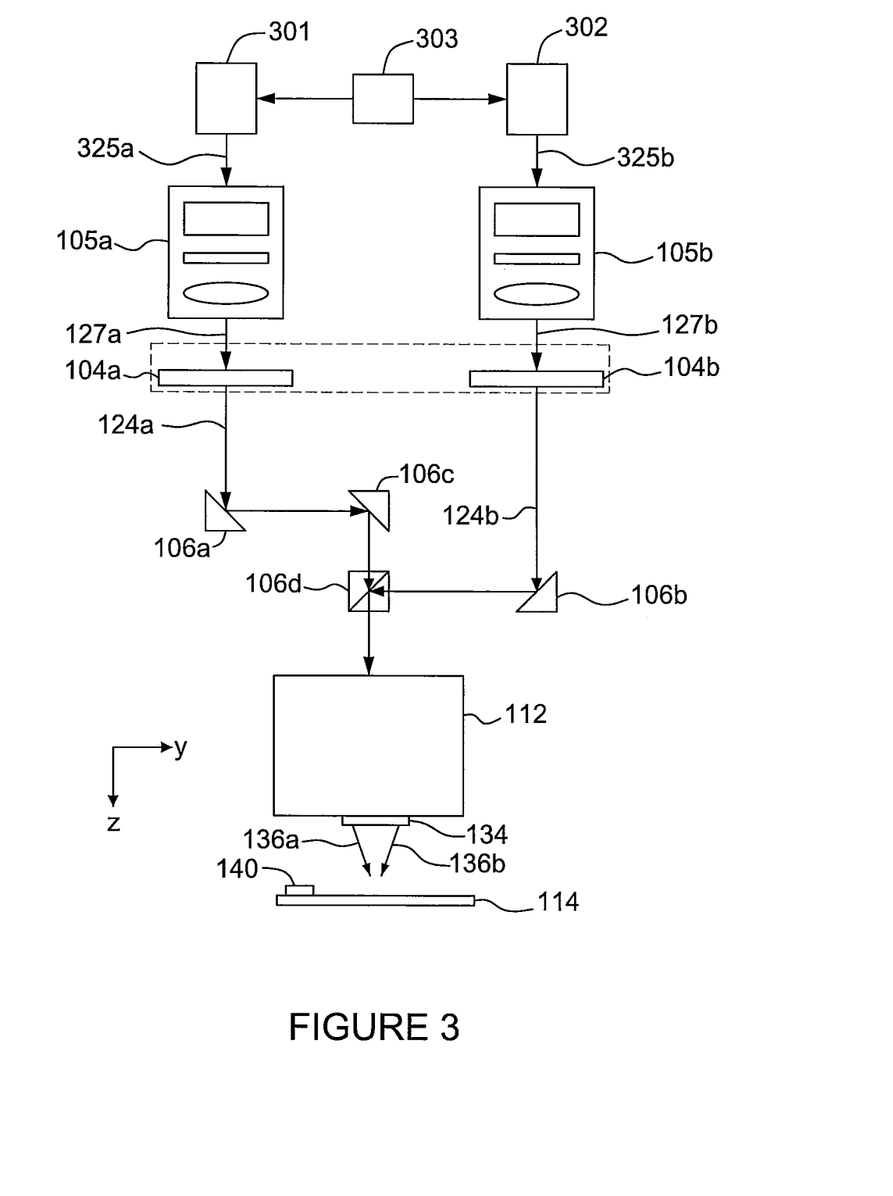
FIG. 3 schematically depicts a lithographic apparatus according to a further embodiment of the invention.

FIG. 3 schematically depicts a lithographic apparatus according to a further embodiment of the invention. In this embodiment, the lithographic apparatus comprises first and second radiation sources 301, 302 and a control unit 303 to control output of the first and second radiation sources 302, 303. The first and second illumination systems, support table, beam combiner, projection system and substrate table may be identical to that of the embodiment described with respect to FIG. 1. In this embodiment, control unit 303 alternately triggers the first and second radiation sources to produce a pulse of radiation. The pulses created by the first radiation source are directed to the first illumination system and the pulses created by the second radiation source are directed to the second illumination system. An advantage of this embodiment is that a higher frequency of pulse emission may be obtained, allowing a higher throughput of the lithographic apparatus. An advantage of this embodiment may be better synchronization between scanning patterning device and substrate tables.

In an embodiment, the lithographic apparatus is an immersion lithographic apparatus, i.e. wherein at least a portion of the substrate is covered by a liquid so as to fill a space between the projection system and the substrate. During operation, the substrate may be heated up by the patterned radiation beam that is incident on the substrate. An advantage of applying a liquid in between the substrate and the projection system is that the liquid absorbs heat from the substrate and due to the continuous flow of the immersion liquid, transfers the heat to outside the exposure area. This results in a reduced heating of the substrate and thereby improves process parameters such as overlay and quality of pattern transfer from the patterning devices to the substrate.

Combinations and/or variations on the above described modes of use or entirely different modes of use may also be employed. Although in the described embodiments, the lithographic apparatus comprises two illumination systems to expose two patterning devices, it should be understood that an embodiment of the invention is not limited to this number of illumination systems. The skilled artisan will appreciate that more than two illumination systems could be used wherein pulses are directed alternately to the plurality of illumination systems.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, an embodiment of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a plurality of illumination systems configured to receive and condition a pulsed radiation beam;
   a beam director arranged between a source of the pulsed radiation beam and the illumination systems, the beam director configured and arranged to alternately direct pulses of the radiation beam to the respective illumination systems;
   a support table constructed to hold a plurality of patterning devices associated with a certain pattern, each of the patterning devices being capable of imparting a respective conditioned radiation beam with a pattern in its cross-section to form respective patterned radiation beams;
   a substrate table constructed to hold a substrate; and
   a projection system configured to project each of the respective patterned radiation beams coincidentally onto a target portion of the substrate to obtain the certain pattern on the substrate.

2. The lithographic apparatus according to claim 1, wherein the beam director is arranged to alternately direct single pulses to the respective illumination systems.

3. The lithographic apparatus according to claim 1, wherein the substrate is substantially coated with a phase change material layer.

4. The lithographic apparatus according to claim 3, wherein the phase change material layer is in a crystalline or polycrystalline state before exposure to the radiation.

5. The lithographic apparatus according to claim 1, wherein the support table and substrate table are synchronized scanning tables.

6. The lithographic apparatus according to claim 1, wherein the beam director is arranged to alternately direct groups of pulses to the respective illumination systems.

7. The lithographic apparatus according to claim 1, wherein the lithographic apparatus is an immersion lithographic apparatus.

8. The lithographic apparatus according to claim 1, wherein the beam director is a beam combiner or beam splitter.

9. The lithographic apparatus according to claim 1, further comprising a radiation source configured to provide the pulsed radiation beam.

10. The lithographic apparatus according to claim 1, further comprising a plurality of radiation sources, each radiation source configured to provide a pulsed radiation beam and corresponding to a respective illumination system, and wherein the beam director comprises a control unit configured to alternately trigger the radiation sources to generate a single pulse or a plurality of pulses.

11. The lithographic apparatus according to claim 1, wherein the plurality of illumination systems are arranged to individually condition the respective radiation beams corresponding to the respective patterns.

12. A device manufacturing method comprising:
providing a pulsed radiation beam;
alternately directing pulses of the radiation beam to a plurality of illumination systems to produce a plurality of respective conditioned radiation beams;
directing each of the respective conditioned radiation beams to one of a plurality of patterning devices, each of the patterning devices having a respective pattern;
imparting each of the conditioned radiation beams with the respective pattern in the respective cross-section of the conditioned radiation beam to form a plurality of respective patterned radiation beams; and
projecting each of the plurality of patterned radiation beams coincidentally onto a target portion of a substrate.

13. The method according to claim 12, comprising alternately directing single pulses to the respective illumination systems.

14. The method according to claim 12, wherein the substrate is coated with a phase change material layer.

15. The method according to claim 14, wherein the phase change material layer is in a crystalline or polycrystalline state before exposure to the radiation.

16. The method according to claim 12, comprising synchronously scanning the patterning devices and the substrate.

17. The method according to claim 12, comprising alternately directing groups of pulses to the respective illumination systems.

18. The method according to claim 12, wherein providing the pulsed radiation beam comprises providing a pulsed radiation beam from each of a plurality of radiation sources to a respective illumination system of the plurality of illumination systems, and comprises alternately triggering the radiation sources to generate a single pulse or a plurality of pulses.

* * * * *